United States Patent
Kippes et al.

(10) Patent No.: US 9,252,344 B2
(45) Date of Patent: Feb. 2, 2016

(54) STRUCTURAL COMPONENT AND METHOD FOR PRODUCING A STRUCTURAL COMPONENT

(75) Inventors: Thomas Kippes, Neumarkt (DE); Stephan Haslbeck, Wiesent (DE); Annaniah Luruthudass, Penang (MY); Ee Lian Lee, Georgetown (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/114,502

(22) PCT Filed: Apr. 12, 2012

(86) PCT No.: PCT/EP2012/056695
§ 371 (c)(1),
(2), (4) Date: Feb. 12, 2014

(87) PCT Pub. No.: WO2012/146490
PCT Pub. Date: Nov. 1, 2012

(65) Prior Publication Data
US 2014/0159101 A1    Jun. 12, 2014

(30) Foreign Application Priority Data
Apr. 29, 2011  (DE) .................. 10 2011 100 028

(51) Int. Cl.
*H01L 33/62* (2010.01)
*H01L 33/54* (2010.01)
*H01L 33/56* (2010.01)

(52) U.S. Cl.
CPC ............ *H01L 33/62* (2013.01); *H01L 33/54* (2013.01); *H01L 33/56* (2013.01); *H01L 2224/32245* (2013.01); *H01L 2224/48091* (2013.01);

(Continued)

(58) Field of Classification Search
USPC ............... 257/98–100; 438/22, 25–27, 29
IPC ........................................................ H01L 33/56
See application file for complete search history.

(56) References Cited

U.S. PATENT DOCUMENTS

| 5,882,949 A * | 3/1999 | Okazaki ................. 438/26 |
| 5,936,264 A * | 8/1999 | Ishinaga ................ 257/99 |
| 6,603,148 B1 | 8/2003 | Sano et al. |

(Continued)

FOREIGN PATENT DOCUMENTS

| DE | 102004029507 A1 | 3/2005 |
| DE | 102008014122 A1 | 6/2009 |

(Continued)

*Primary Examiner* — Eugene Lee
(74) *Attorney, Agent, or Firm* — McDermott Will & Emery LLP

(57) ABSTRACT

The invention relates to a structural component which comprises a support (1), an optoelectronic semiconductor chip (2) having at least one lateral face (2a), further comprising a connecting means (3), a first molded element (4), and a second molded element (5), the optoelectronic semiconductor chip (2) being mechanically connected to the support (1) by the connecting means (3). The first molded element (4) covers an exposed outer face of the optoelectronic semiconductor chip (2) and the first molded element (4) covers an exposed outer face of the connecting means (3). The second molded element (5) covers an exposed outer face of the first molded element (5) and the second molded element (5) has a higher modulus of elasticity at room temperature than the first molded element.

14 Claims, 2 Drawing Sheets

Figure 1A:
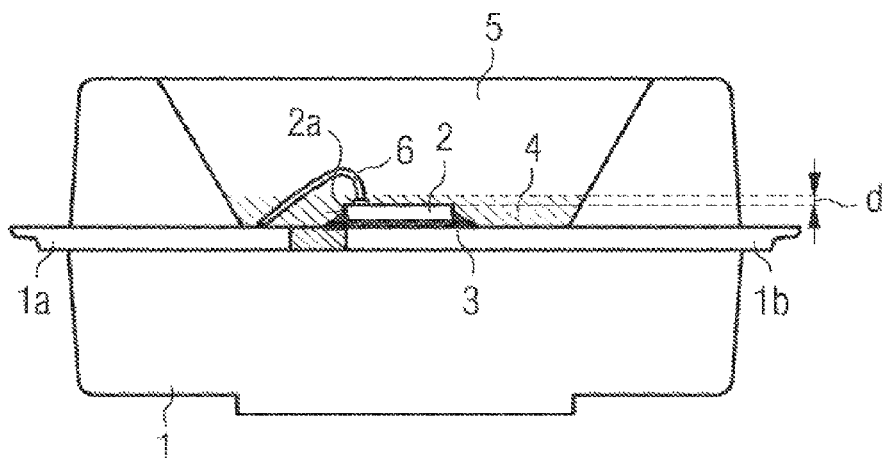

(52) U.S. Cl.
CPC ............ *H01L2224/48247* (2013.01); *H01L 2224/73265* (2013.01); *H01L 2224/8592* (2013.01)

(56) References Cited

U.S. PATENT DOCUMENTS

| | | | |
|---|---|---|---|
| 6,624,491 B2 | 9/2003 | Waitl et al. | |
| 6,940,184 B2 | 9/2005 | Ueda et al. | |
| 7,075,114 B2 * | 7/2006 | Abe et al. | 257/98 |
| 7,456,499 B2 * | 11/2008 | Loh et al. | 257/710 |
| 7,655,486 B2 * | 2/2010 | Thompson et al. | 438/25 |
| 7,710,016 B2 * | 5/2010 | Miki et al. | 313/502 |
| 7,855,395 B2 * | 12/2010 | Lee et al. | 257/99 |
| 8,247,263 B2 * | 8/2012 | Braune et al. | 438/99 |
| 2006/0012299 A1 | 1/2006 | Suehiro et al. | |
| 2006/0186431 A1 | 8/2006 | Miki et al. | |
| 2007/0287208 A1 | 12/2007 | Thompson et al. | |
| 2008/0023721 A1 | 1/2008 | Lee et al. | |
| 2008/0191620 A1 | 8/2008 | Moriyama et al. | |
| 2009/0065792 A1 | 3/2009 | Thompson et al. | |
| 2009/0166665 A1 * | 7/2009 | Haitko | 257/100 |
| 2011/0024790 A1 | 2/2011 | Wegleiter et al. | |
| 2011/0204407 A1 * | 8/2011 | Cupta et al. | 257/98 |

FOREIGN PATENT DOCUMENTS

| | | |
|---|---|---|
| EP | 1081761 A1 | 3/2001 |
| EP | 1249875 A2 | 10/2002 |
| EP | 1437776 A1 | 7/2004 |
| EP | 1684363 A2 | 7/2006 |
| EP | 1953835 A1 | 8/2008 |
| TW | 200644284 A | 12/2006 |
| TW | I286393 B | 9/2007 |
| TW | 200804467 A | 1/2008 |
| TW | I302384 B | 10/2008 |
| TW | 200947732 A | 11/2009 |
| WO | 2006006544 A1 | 1/2006 |
| WO | 2006059828 A1 | 6/2006 |

* cited by examiner

STRUCTURAL COMPONENT AND METHOD FOR PRODUCING A STRUCTURAL COMPONENT

Structural component and method for producing a structural component.

A structural component is specified.

The document U.S. Pat. No. 6,624,491 describes a structural component.

One object to be achieved is to specify a structural component which is particularly stable mechanically in particular with regard to temperature changes.

In accordance with at least one embodiment of the structural component, the structural component comprises a carrier. The carrier can be a connection carrier, for example, on which component parts of the structural component can be mechanically fixed and electrically connected. By way of example, the carrier is then a circuit board, such as a printed circuit board, for instance. Furthermore, the carrier can be a housing comprising a leadframe, for example, on which component parts of the structural component can be mechanically fixed and electrically connected.

In accordance with at least one embodiment of the structural component, the structural component comprises an optoelectronic semiconductor chip. The optoelectronic semiconductor chip is a light-emitting diode chip, for example, which emits electromagnetic radiation from the spectral range between UV radiation and infrared radiation during operation. In particular, it is possible for the optoelectronic semiconductor chip to generate light during operation.

The optoelectronic semiconductor chip comprises at least one side surface, for example four side surfaces, which terminate and delimit the optoelectronic semiconductor chip in a lateral direction. Furthermore, the optoelectronic semiconductor chip comprises a radiation exit surface, which can be formed for example by a main surface of the optoelectronic semiconductor chip that runs transversely with respect to the side surfaces. Furthermore, it is possible for the radiation exit surface also to at least partly encompass the side surfaces of the optoelectronic semiconductor chip. That is to say that part of the generated radiation can also emerge through the side surfaces of the optoelectronic semiconductor chip from the latter.

In the case of the structural component described here, it is also possible, in particular, for the structural component to comprise two or more optoelectronic semiconductor chips which can be fashioned in an identical way or differently. By way of example, the structural component can comprise at least one optoelectronic semiconductor chip which emits red light, at least one optoelectronic semiconductor chip which emits blue light and at least one optoelectronic semiconductor chip which emits green light and/or a optoelectronic semiconductor chip which emits light of a different color.

In accordance with at least one embodiment of the structural component, the structural component comprises a connecting means. By means of the connecting means, component parts of the structural component can for example be fixed to the carrier and, if appropriate, electrically connected to the carrier. The connecting means can be a solder material, an adhesive or a conductive adhesive.

In accordance with at least one embodiment of the structural component, the structural component comprises a first shaped body and a second shaped body. The shaped bodies are, in particular, radiation-transmissive bodies which can be formed with an electrically insulating material. The shaped bodies are produced for example by methods such as potting, injecting, dispensing, cold forming, embossing, etching techniques and, if appropriate, subsequent curing.

In accordance with at least one embodiment of the structural component, the optoelectronic semiconductor chip is mechanically connected to the carrier by means of the connecting means. That is to say that the connecting means is for example in direct contact with the semiconductor chip and the carrier and in this way imparts a mechanically fixed connection between the optoelectronic semiconductor chip and the carrier. Release of the mechanical connection produced by the connecting means between semiconductor chip and carrier generally leads to destruction of the structural component. Alongside the mechanical connection, the connecting means can also produce an electrical connection between the optoelectronic semiconductor chip and the carrier. For this purpose, the connecting means can be embodied in particular in an electrically conductive fashion.

In accordance with at least one embodiment of the structural component, the first shaped body covers an exposed outer surface of the optoelectronic semiconductor chip. In particular, it is possible for the first shaped body to completely cover the exposed outer surface of the optoelectronic semiconductor chip. The exposed outer surface of the optoelectronic semiconductor chip is that outer surface of the optoelectronic semiconductor chip which for example is not covered by the connecting means and/or by the carrier. That is to say that those places of the outer surface of the optoelectronic semiconductor chip which are not covered by other component parts of the structural component before the application of the first shaped body are covered by the first shaped body. At these places the first shaped body can be in direct contact with the optoelectronic semiconductor chip. That is to say that the first shaped body is for example then in direct contact with a passivation of the semiconductor chip and/or a contact layer of the optoelectronic semiconductor chip.

In accordance with at least one embodiment of the structural component, the first shaped body covers an exposed outer surface of the connecting means. In this case, it is possible, in particular, for the first shaped body to completely cover the exposed outer surface of the connecting means. The exposed outer surface of the connecting means is that outer surface which is not covered by other component parts of the structural component before the application of the first shaped body. By way of example, it is that outer surface of the connecting means which is not covered by the carrier and/or by the optoelectronic semiconductor chip or directly adjoins the latter. In this case, it is possible for the first shaped body also to cover other component parts of the structural component at least in places. By way of example, the first shaped body can also cover the carrier in a region around the optoelectronic semiconductor chip and there be in direct contact with the carrier.

In accordance with at least one embodiment of the structural component, the second shaped body covers an exposed outer surface of the first shaped body. In particular, it is possible for the second shaped body to completely cover the exposed outer surface of the first shaped body. That is to say that where the first shaped body is exposed and is not covered by other component parts of the structural component before the application of the second shaped body, the second shaped body is then arranged and is for example in direct contact with the first shaped body.

In accordance with at least one embodiment of the structural component, the second shaped body has a higher modulus of elasticity than the first shaped body. By way of example, the second shaped body has a modulus of elasticity of at least 2 GPa and the first shaped body has a modulus of elasticity of at most 1 GPa, in particular of at most 200 kPa. For this purpose, the first shaped body and the second shaped body are formed in particular with different materials. The different moduli of elasticity arise for example in a temperature range of at least 0° C. to at most 100° C., in particular at room temperature, which is 23° C., for example.

In accordance with at least one embodiment of the structural component, the structural component comprises a carrier, an optoelectronic semiconductor chip having at least one side surface, and a connecting means. Furthermore, the structural component comprises a first shaped body and a second shaped body. The optoelectronic semiconductor chip is mechanically connected to the carrier by means of the connecting means, the first shaped body covers an exposed outer surface of the optoelectronic semiconductor chip, the first shaped body covers an exposed outer surface of the connecting means, and the second shaped body covers an exposed outer surface of the first shaped body. In this case, the second shaped body has a higher modulus of elasticity than the first shaped body.

The structural component described here is in this case based on the following insight, inter alia: in conventional structural components, as described for example in the document cited above, optoelectronic semiconductor chips are often potted with a relatively inelastic material such as an epoxy resin. It has now been found that such an inelastic material exerts a high mechanical stress on the optoelectronic semiconductor chip and the connection between optoelectronic semiconductor chip and carrier imparted by a connecting means. This mechanical loading can lead in particular to damage or destruction of the connection imparted by the connecting means. By way of example, this high loading occurs in the event of temperature changes, such as when the structural component is soldered on at its intended location.

In the present case, the optoelectronic semiconductor chip and the connecting means are covered by a first shaped body, which has a lower modulus of elasticity than a second shaped body, which covers the first shaped body. The first shaped body, which in particular completely covers connecting means and optoelectronic semiconductor chip, can absorb and damp mechanical stress transmitted by the second shaped body. The mechanical loading in particular on the connection between optoelectronic semiconductor chip and carrier is reduced in this way. This results in a structural component which is mechanically stabler and thus more durable. In particular the risk of the connecting means detaching from the carrier and/or from the optoelectronic semiconductor chip is greatly reduced in the structural component described.

Furthermore, the use of a second shaped body having a higher modulus of elasticity than the first shaped body makes it possible, for example, for optical component parts, such as lenses, which are formed with a relatively rigid material to be adhesively bonded directly onto the second shaped body. That is to say that a high mechanical loading in particular in the event of a temperature change between the second shaped body and the optical element can be reduced in comparison with a structural component that only has a first shaped body composed of relatively flexible material.

In accordance with at least one embodiment of the structural component, the second shaped body has a higher hardness than the first shaped body. That is to say that the first shaped body and the second shaped body can also differ from one another with regard to their hardness, in addition to their difference with regard to the modulus of elasticity. A lower hardness of the first shaped body in comparison with the second shaped body also improves the mechanical decoupling between the second shaped body and the connection between optoelectronic semiconductor chip and carrier. By way of example, the first shaped body has a hardness between Shore A0 and Shore A38 at room temperature. The second shaped body then has a higher hardness.

In accordance with at least one embodiment of the structural component, the first shaped body is formed predominantly or completely with a silicone, and the second shaped body is formed predominantly or completely with an epoxy resin.

By way of example, the first shaped body can be formed with a silicone whose refractive index is matched to the refractive index of the second shaped body. In this case, a high refractive index silicone having a refractive index of at least 1.53 can be used for the first shaped body. By way of example, the refractive index of the silicone is between 1.53 and 1.55. The refractive index of the second shaped body, which is formed with epoxy resin, for example, is then likewise in this range and is at least 1.53. The refractive index of the second shaped body can then for example likewise be between 1.53 and 1.55. In this way, losses, for example as a result of total internal reflection, between the first shaped body and the second shaped body are reduced, with the result that the mechanical stability of the structural component is increased by the use of the first shaped body, without its optical efficiency being significantly reduced.

In accordance with at least one embodiment of the structural component, the connecting means covers in places the side surfaces of the optoelectronic semiconductor chip and a surface of the carrier that faces the optoelectronic semiconductor chip. That is to say that the connecting means imparts a mechanical connection between the carrier and the optoelectronic semiconductor chip and in this case engages in places at a side surface or the side surfaces of the optoelectronic semiconductor chip. The parts of the side surface or of the side surfaces of the optoelectronic semiconductor chip which are covered by the connecting means in places are then free of the first shaped body.

In accordance with at least one embodiment of the structural component, the first shaped body is free of foreign particles. That is to say that in particular no particles of a luminescence conversion material are then introduced into the first shaped body, which particles can adversely influence the modulus of elasticity and the hardness of the first shaped body. In this case, the first shaped body can be embodied in a transparent and in particular pellucid fashion.

In accordance with at least one embodiment of the structural component, foreign particles such as, for example, particles of a luminescence conversion material are introduced into the first shaped body. In this case, for example, electromagnetic radiation can be converted near the chip.

In accordance with at least one embodiment of the structural component, the first shaped body has substantially the same optical refractive index as the second shaped body. In this case, "substantially the same optical refractive index" means that the refractive indices of the two shaped bodies deviate from one another by at most 10%, in particular by at most 5%, for example by at most 2.5%. Optical losses at the interface between the two shaped bodies can be reduced in this way.

In accordance with at least one embodiment of the structural component, the structural component comprises a contact-making wire connected to the optoelectronic semiconductor chip at its side facing away from the carrier. The contact-making wire electrically conductively connects the optoelectronic semiconductor chip to a part of the carrier. By way of example, the contact-making wire is situated at the n-side of the optoelectronic semiconductor chip.

In this case, the contact-making wire is, in particular, free or for the most part free of the first shaped body. That is to say that the first shaped body is not shaped over the contact-making wire and covers the contact-making wire only in places. "For the most part free" means, in particular, that the contact-making wire is covered with material of the first shaped body over a length of at most 49% of its total length. In particular, at most 20%, preferably at most 10%, of the contact-making wire is covered with material of the first shaped body.

It has been found that a covering of the optoelectronic semiconductor chip with the first shaped body also at its side facing away from the carrier is advantageous. However, in order not to jeopardize the mechanical stability of the contact-making wire, it proves to be advantageous if, in particular, the part of the contact-making wire which is furthest away from the carrier is not covered by the first shaped body. That is to say that, in particular, the wire loop of the contact-making wire should not be covered by the first shaped body. This part of the contact-making wire is then preferably covered by the second shaped body and embedded into the latter. On account of the fact that the second shaped body is mechanically more rigid than the first shaped body, the contact-making wire is likewise mechanically stabilized by being embedded in the second shaped body.

In accordance with at least one embodiment of the structural component, the first shaped body, at that side of the optoelectronic semiconductor chip which faces away from the carrier, has a thickness of at most 500 µm, for example at most 300 µm, in particular at most 100 µm, above the optoelectronic semiconductor chip. That is to say that the first shaped body is led only in a thin layer over the top side of the semiconductor chip facing away from the carrier. It has been found in this case that such a thin region of the first shaped body above the semiconductor chip is sufficient for mechanically decoupling the connection between semiconductor chip and carrier from the second shaped body. If the first shaped body is made as thin as possible above the optoelectronic semiconductor chip, this advantageously has the result that the second shaped body directly above the semiconductor chip can be made relatively thick which overall increases the mechanical stability of the structural component.

In accordance with at least one embodiment of the structural component, the carrier has a depression at its side facing the optoelectronic semiconductor chip, wherein the optoelectronic semiconductor chip is arranged in the depression and the first shaped body projects above a side wall of the depression. That is to say that the depression is filled with the optoelectronic semiconductor chip and the first shaped body, wherein the first shaped body can project above a side wall of the depression. The first shaped body has for example, at its side facing away from the carrier, a convex curvature which spans the optoelectronic semiconductor chip in a dome-like manner, wherein the vertex of the dome is higher than the highest point of the side wall of the depression.

In accordance with at least one embodiment of the structural component, the connecting means is formed with an adhesive. In particular, the adhesive can be an electrically conductive adhesive. Primarily for connecting means formed on the basis of an adhesive, a structural component described here proves to be particularly advantageous since such connecting means often impart mechanical connections which are weaker than, for example, connections imparted by solder. The connection between semiconductor chip and carrier that is imparted by an adhesive is therefore protected particularly efficiently in the present case.

Furthermore, a method for producing a structural component is specified. By way of example, a structural component described here can be produced by means of the method. That is to say that all features disclosed for the structural component are also disclosed for the method, and vice versa.

In the method, in one embodiment, firstly a carrier is provided, on which an optoelectronic semiconductor chip having at least one side surface is fixed by means of a connecting means. Alongside the mechanical connection, an electrical contact-connection of the semiconductor chip to the carrier can also be effected in this case.

Afterward, a first shaped body is applied to an exposed outer surface of the optoelectronic semiconductor chip and an exposed outer surface of the connecting means; in particular, all exposed outer surfaces of the semiconductor chip and connecting means are covered by the first shaped body.

Afterward, the first shaped body is incipiently cured. In this case, the incipient curing is effected directly after the application of the first shaped body. That is to say that the incipient curing is effected for example in particular within at most one minute after the application of the first shaped body. For the purpose of incipient curing, the first shaped body is heated for example to a first temperature. Afterward, the first shaped body is fully cured at a second temperature, which can be different than the first temperature. Additionally or alternatively, the incipient curing can be effected chemically or by radiation crosslinking.

In a next step, a second shaped body is applied to an exposed outer surface of the first shaped body; in particular, the second shaped body is applied to all exposed outer surfaces of the first shaped body. In this case, the second shaped body has a higher modulus of elasticity than the first shaped body. Furthermore, the first temperature, at which the first shaped body is incipiently cured, is greater than the second temperature, at which the shaped body is fully cured.

The method described here is in this case based on the insight, inter alia, that materials for first shaped bodies which have a relatively low modulus of elasticity can rapidly run during application. Therefore, it proves to be advantageous if incipient curing of the first shaped body is effected rapidly and at relatively high temperatures. If the first shaped body is for example a shaped body formed with a silicone, then the incipient curing is preferably effected at temperatures of greater than 150° C. Alternatively or additionally, chemical incipient curing or incipient curing by radiation crosslinking can be effected. The full curing is then effected for example at a temperature of less than or equal to 150° C. By way of example, the first shaped body is incipiently cured for a time period of at most 15 minutes and fully cured for a time period of at least 30 minutes. In this case, incipient curing and full curing can be effected in the same furnace.

In accordance with at least one embodiment of the method, the carrier with the semiconductor chip fixed on the carrier is heated before the application of the first shaped body, such that the carrier is at a third temperature during the application of the first shaped body, said third temperature being greater than room temperature. Room temperature is 23° C. in this case. The third temperature is, for example, less than or equal to the first temperature. By way of example, the third temperature for a first shaped body formed with silicone is chosen to be between at least 100° C. and at most 150° C. It has been found in this case that such preheating of the carrier can prevent the first shaped body from running during application, since the material of the first shaped body, when it impinges on the heated carrier, immediately incipiently cures and can thus be fixed with a particularly accurate fit to the semiconductor chip and to the carrier in the vicinity of the semiconductor chip.

The structural component described here and also the method described here are explained in greater detail below on the basis of exemplary embodiments and the associated figures.

Figure 1B:
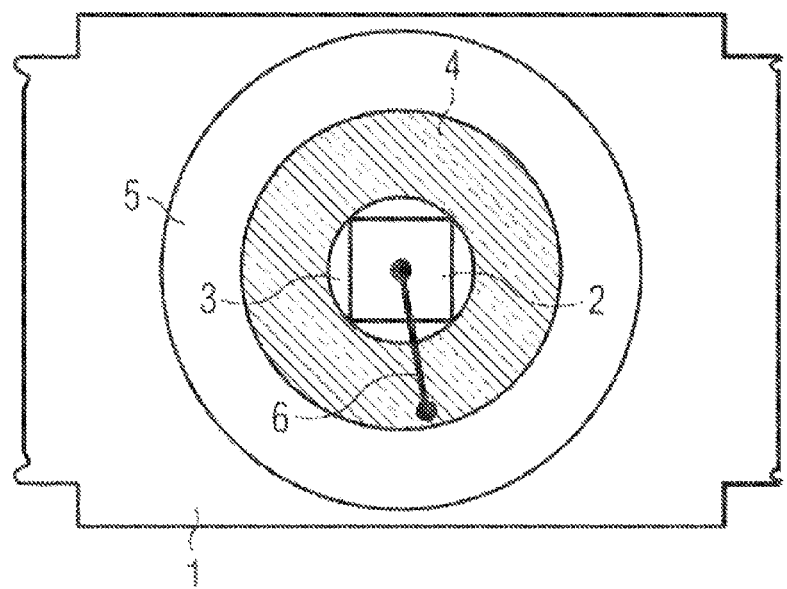
Figure 2:
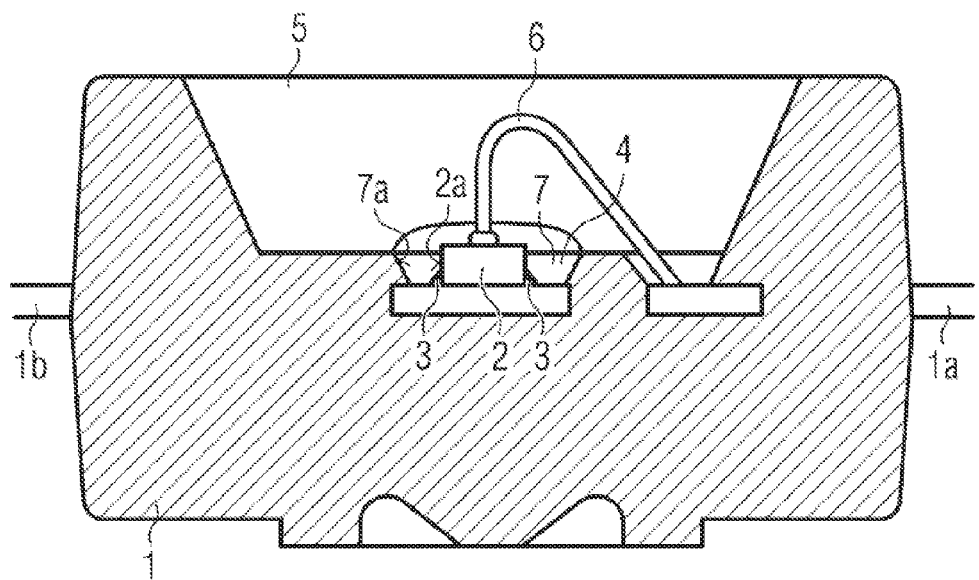

The schematic views in FIGS. 1A, 1B and 2 show exemplary embodiments of structural components described here.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

A first exemplary embodiment of a structural component described here is explained in greater detail in the schematic sectional illustration in FIG. 1A. The structural component comprises a carrier 1, which in the present case is formed as a structural component housing with leadframes 1a, 1b, which are embodied for example as metal strips.

In the present case, an optoelectronic semiconductor chip 2, for example a light-emitting diode chip or a photodiode chip, is fixed to the carrier 1 by means of the connecting means 3. A connecting means 3 is for example an adhesive, for example an electrically conductive adhesive. Exposed outer surfaces of the semiconductor chip 2 and in this case in particular that surface of the semiconductor chip 2 which faces away from the carrier 1 are covered by the first shaped body 4, which is formed for example with a high refractive index silicone.

The semiconductor chip 2 is connected to the carrier 1 by means of a contact-making wire (also called: bonding wire) 6 and is electrically contact-connected on the n-side for example in this way. In particular the part of the contact-making wire 6 which is furthest away from the carrier 1 is left such that it is not covered by the first shaped body 4.

The second shaped body 5, which is formed with an epoxy resin, for example, directly adjoins the exposed outer surface of the first shaped body 4. In this case, the refractive indices of first shaped body 4 and second shaped body 5 are matched to one another, such that hardly any optical losses occur when radiation generated in the optoelectronic semiconductor chip 2 crosses from the first shaped body 4 into the second shaped body 5.

In this case, the first shaped body 4 has for example a thickness d of at most 300 μm to 500 μm above that surface of the optoelectronic semiconductor chip 2 which faces away from the carrier 1.

The thermal expansion of the first shaped body and of the second shaped body 5 is proportional to the temperature difference and to the modulus of elasticity of the two shaped bodies. The smaller the modulus of elasticity, then the smaller the thermal expansion and the smaller, therefore, the mechanical loading of the regions and component parts covered by the shaped bodies 4, 5. The use of a first shaped body 4 having a low modulus of elasticity therefore enables a reduction of the mechanical loading on account of a reduction of the thermal expansion in particular in the region of the connection between optoelectronic semiconductor chip 2 and carrier 1. At the same time, the component parts of the structural component are protected against mechanical influences from outside the structural component by the relatively rigid and hard second shaped body 5. In this case, the first shaped body 4 acts as an absorber for mechanical loading, thus resulting in an increased mechanical stability, in particular an increased thermal stability of the connection between semiconductor chip 2 and carrier 1.

FIG. 1B shows the plan view of the structural component corresponding to FIG. 1A. In particular, it can be seen that the first shaped body 4 completely covers exposed outer surfaces both of the connecting means 3 and of the optoelectronic semiconductor chip 2. That is to say that exposed side surfaces 2a of the semiconductor chip 2 are also covered by the first shaped body 4.

In contrast to the exemplary embodiment described in conjunction with FIGS. 1A, 1B, in the case of the exemplary embodiment in FIG. 2, the optoelectronic semiconductor chip is arranged in a depression 7. In this case, the depression 7 forms, by means of its side walls 7a, a protection for the material of the first shaped body 4 against running. With the use of a depression 7, it is possible for example to dispense with preheating of the carrier 1 before the application of the first shaped body 4. Furthermore, this advantageously has the result that the contact-making wire 6 is almost completely left such that it is not covered by the first shaped body 4, and is enclosed for the most part by the second shaped body 5. This further increases the mechanical stability of the structural component.

The structural components illustrated in conjunction with FIGS. 1 and 2 can be produced for example as follows: firstly, the carrier 1 is provided. Subsequently, the optoelectronic semiconductor chip is fixed onto the carrier 1 by means of the connecting means 3. This can be done by adhesive bonding, for example. In a next method step, the first shaped body 4 is applied to the exposed outer surfaces of the optoelectronic semiconductor chip and the exposed outer surfaces of the connecting means 3; this is done for example by dispensing the shaped body. The first shaped body is then incipiently cured at a first temperature and fully cured at a second temperature, which can be lower than the first temperature.

Subsequently, the second shaped body 5 is applied to the exposed outer surfaces of the first shaped body 4. This is done for example by potting or transfer molding.

Particularly in the case of the exemplary embodiment in FIGS. 1a, 1B, the carrier here being free of a depression in which the semiconductor chip 2 can be arranged, it can be advantageous if the carrier with the semiconductor chip 2 fixed on the carrier 1 is heated to a third temperature before the application of the first shaped body 4, said third temperature being less than or equal to the first temperature. Undesirable running of the shaped body 4 or wetting of parts of the carrier 1 and/or of the contact-making wire 6 can be efficiently prevented in this way, too.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102011100028.7, the disclosure content of which is hereby incorporated by reference.

The invention claimed is:

1. A structural component comprising:
   a carrier;
   an optoelectronic semiconductor chip having at least one side surface;
   a connecting means;
   a contact-making wire connected to the optoelectronic chip at its side facing away from the carrier;

a first shaped body; and
a second shaped body, wherein
the optoelectronic semiconductor chip is mechanically connected to the carrier by means of the connecting means,
the connecting means covers in places the side surface of the optoelectronic semiconductor chip and a surface of the carrier which faces the optoelectronic semiconductor chip,
the connecting means is arranged directly between the optoelectronic semiconductor chip and the surface of the carrier which faces the optoelectronic semiconductor chip,
the first shaped body covers an exposed outer surface of the optoelectronic semiconductor chip,
the first shaped body covers an exposed outer surface of the connecting means,
the second shaped body covers an exposed outer surface of the first shaped body, and
the second shaped body has a higher modulus of elasticity at room temperature than the first shaped body.

2. The structural component according to claim 1, wherein the second shaped body has a higher hardness than the first shaped body.

3. The structural component according to claim 1, wherein the first shaped body is formed predominantly or completely with a silicone and the second shaped body is formed predominantly or completely with an epoxy resin.

4. The structural component according to claim 1, wherein the first shaped body covers the optoelectronic semiconductor chip at its side facing away from the carrier.

5. The structural component according to claim 1, wherein the first shaped body is free of foreign particles.

6. The structural component according to claim 1, wherein the first shaped body has substantially the same optical refractive index as the second shaped body.

7. The structural component according to claim 1, of the first shaped body.

8. The structural component according to claim 1, wherein the first shaped body, at that side of the optoelectronic semiconductor chip which faces away from the carrier, has a thickness of at most 100 μm above the optoelectronic semiconductor chip.

9. The structural component according to claim 1, further comprising a depression in the carrier, wherein the optoelectronic semiconductor chip is arranged in the depression and the first shaped body projects above a side wall of the depression.

10. The structural component according to claim 1, wherein the connecting means is formed with an adhesive.

11. A method for producing a structural component comprising the following steps:
providing a carrier;
fixing an optoelectronic semiconductor chip having at least one side surface onto the carrier by means of a connecting means;
applying a first shaped body to an exposed outer surface of the optoelectronic semiconductor chip and an exposed outer surface of the connecting means;
incipiently curing the first shaped body;
fully curing the first shaped body; and
applying a second shaped body to an exposed outer surface of the fully cured first shaped body,
wherein
the connecting means is in direct contact with a surface of the optoelectronic semiconductor chip facing the carrier,
the connecting means is in direct contact with at least one two of the at least one side surfaces of the optoelectronic semiconductor chip, and
the second shaped body has a higher modulus of elasticity at room temperature than the first shaped body.

12. The method according to claim 11, wherein
the incipient curing is effected at a first temperature,
the full curing is effected at a second temperature,
the carrier with the semiconductor chip fixed on the carrier is heated before the first shaped body is applied, such that the carrier is at a third temperature during the application of the first shaped body,
the third temperature is greater than room temperature, and
the second temperature is less than the first temperature.

13. The method according to claim 12, wherein the third temperature is less than or equal to the first temperature.

14. A structural component comprising:
a carrier;
an optoelectronic semiconductor chip having at least one side surface,
a connecting means;
a first shaped body; and
a second shaped body, wherein
the optoelectronic semiconductor chip is mechanically connected to the carrier by means of the connecting means,
the first shaped body covers an exposed outer surface of the optoelectronic semiconductor chip,
the first shaped body covers an exposed outer surface of the connecting means,
the second shaped body covers an exposed outer surface of the first shaped body,
the second shaped body has a higher modulus of elasticity at room temperature than the first shaped body,
the connecting means covers in places the side surface of the optoelectronic semiconductor chip and a surface of the carrier which faces the optoelectronic semiconductor chip,
the connecting means is formed with an adhesive, and
the first shaped body, at that side of the optoelectronic semiconductor chip which faces away from the carrier, has a thickness of at most 100 μm above the optoelectronic semiconductor chip.

* * * * *

UNITED STATES PATENT AND TRADEMARK OFFICE
CERTIFICATE OF CORRECTION

PATENT NO. : 9,252,344 B2  
APPLICATION NO. : 14/114502  
DATED : February 2, 2016  
INVENTOR(S) : Thomas Kippes et al.

Page 1 of 1

It is certified that error appears in the above-identified patent and that said Letters Patent is hereby corrected as shown below:

IN THE CLAIMS:

In Column 10, Line 12

Replace "two of the at least", with --of the at least--.

Signed and Sealed this  
Thirty-first Day of May, 2016

Michelle K. Lee  
*Director of the United States Patent and Trademark Office*